United States Patent [19]

Yamada et al.

[11] 4,009,398

[45] Feb. 22, 1977

[54] SAWTOOTH WAVE FORM CIRCUIT

[75] Inventors: Kouichi Yamada, Higashiosaka; Tatsuo Mizota, Kadoma; Kiyoshi Takeda, Katano; Kunio Aoki, Toyama, all of Japan

[73] Assignee: Matsushita Electric Industrial Co., Ltd., Kadoma, Japan

[22] Filed: May 30, 1975

[21] Appl. No.: 582,192

[30] Foreign Application Priority Data

June 4, 1974   Japan .............................. 49-63554

[52] U.S. Cl. .............................. 307/228; 307/261; 307/263; 328/35; 328/181; 328/183
[51] Int. Cl.² ...................... H03K 4/08; H03K 4/48
[58] Field of Search .......... 307/228, 263, 268, 261; 328/35, 181, 183-185

[56] References Cited
UNITED STATES PATENTS

| 3,198,963 | 8/1965 | Halsted | 307/263 X |
| 3,440,448 | 4/1969 | Dudley | 328/185 X |
| 3,735,151 | 5/1973 | Frederiksen et al. | 307/235 T |

*Primary Examiner*—John Zazworsky
*Attorney, Agent, or Firm*—Wenderoth, Lind & Ponack

[57] ABSTRACT

A sawtooth wave forming circuit has an input signal alternately applied to the bases of first and a second transistors forming a differential amplifier, and a circuit which permits flow of a current equal to or proportional to the current flowing in the collector of the first transistor is connected between the differential amplifier and a power source. A capacitor is provided between ground and the junction between the circuit and differential amplifier. With this arrangement, the charge-discharge cycle of the capacitor is controlled by means of the input signal.

By making use of the sawtooth wave forming circuit constituted in this way, stable trapezoidal or triangular waves having only small fluctuations in the slopes of the sides of the wave can be formed.

2 Claims, 4 Drawing Figures

SAWTOOTH WAVE FORM CIRCUIT

BACKGROUND OF THE INVENTION

1. Field of the Invention

The present invention relates to a sawtooth wave forming circuit, and it particularly pertains to a sawtooth wave forming circuit in which a differential amplifier is utilized.

2. Description of the Prior Art

The theoretical diagram of a conventional circuit for forming a trapezoidal wave, which is a kind of a sawtooth wave, is shown in FIG. 1. Resistances 1 and 2 determine the bias, while a resistance 3 sets the value of the constant current. Then, a transistor 4 operates in such a way as to charge a capacitor 5 with the constant current set by the resistance 3. With resistances 6 and 7 determining the bias, and a resistance 8 setting the value of the constant current, a transistor 9 operates in such a way as to discharge from the capacitor 5 the constant current set by the resistance 8. Numerals 10 and 11 denote switches for alternately connecting capacitor 5 for the charge-discharge cycle, and 12 denotes a D.C. voltage source. In this circuit, when the switch 10 is closed, while the switch 11 is opened, the constant current $I_1$ is charged into the capacitor 5; on the other hand, when the switch 11 is closed, while the switch 10 is opened, the constant current $I_2$ is discharged from the capacitor 5.

Now, assuming the values of resistances 1, 2, 3, 6, 7 and 8 respectively to be $R_1$, $R_2$, $R_3$, $R_6$, $R_7$, and $R_8$, and neglecting $h_{FE}$ of the transistors 4 and 9, the constant currents $I_1$ and $I_2$ are given by:

$$I_1 = \frac{V - \left(\frac{V \cdot R_2}{R_1 + R_2} + V_{BE}\right)}{R_3}$$

$$I_2 = \frac{V - \left(\frac{V \cdot R_7}{R_6 + R_7} - V_{BE}\right)}{R_8}$$

However, because two circuits for supplying the constant currents $I_1$ and $I_2$ are provided, it is difficult to have identical values of constant currents $I_1$ and $I_2$ due to the disparity among the resistances 1, 2, 3, 6, 7 and 8, when forming them in a semiconductor integrated circuit. The slopes of the rise and fall of the trapezoidal wave obtained are different.

BRIEF SUMMARY OF THE INVENTION

The first object of the present invention which is intended to solve the above-described problems, is to provide a saw-tooth wave forming circuit capable of forming stable trapezoidal or triangular waves involving only small fluctuations in the slopes of the rise and fall of the waves.

The second object of this invention is to provide a sawtooth wave forming circuit capable of simultaneously and arbitrarily altering the slopes of the rise and fall of the waves.

Those objects are achieved by the saw-tooth wave forming circuit of this invention which comprises first and a second transistors constituting a differential amplifier, a bias source coupled to the bases of the first and the second transistors, which determines the base current and voltage of the transistors, a switching circuit for alternately applying to the first and second transistors the input signal from the bias source, a constant current circuit inserted between a power source and the collectors of the differential amplifier, for causing to flow in the second transistor a current equal to or proportional to the current which flows in the collector of the first transistor, and a capacitor connected between the ground and the junction between the constant current circuit and the differential amplifier, whereby the charge-discharge of the capacitor is controlled by the input signal.

Other objects and features of this invention will become more apparent from the following detailed description:

DETAILED DESCRIPTION OF PREFERRED EMBODIMENTS

Figure 1:
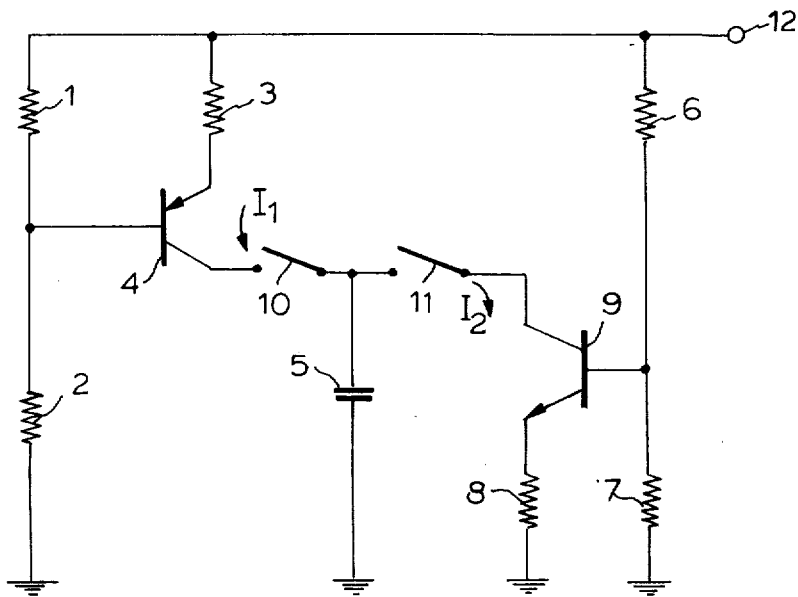
FIG. 1 is a circuit diagram showing the elements of a conventional trapezoidal wave forming circuit.
Figure 2:
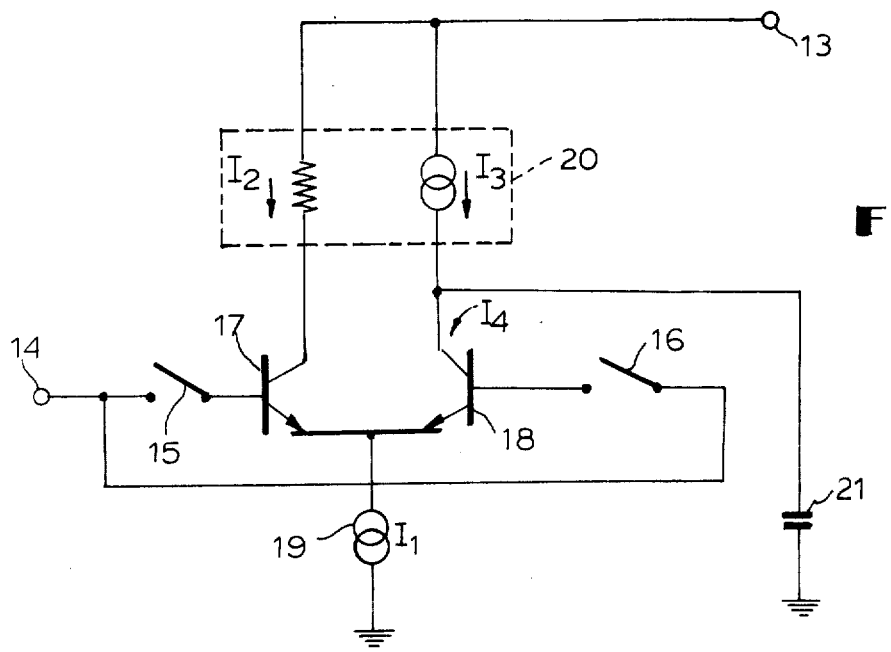
FIG. 2 is a circuit diagram showing the basic trapezoidal wave forming circuit of this invention.

Referring to FIG. 2, which shows the basic composition of the trapezoidal wave forming circuit of this invention, a terminal 13 is for a D.C. voltage source, while a terminal 14 denotes a base terminal for applying a voltage and current. Numerals 15 and 16 indicate switches, and transistors 17 and 18 are connected as a differential amplifier. Numeral 19 designates a constant current source, while a constant current circuit is indicated by numeral 20. A capacitor 21 is used for charge-discharge. The voltage and current are alternately applied through the switches 15 and 16 from the base terminal 14 of the differential amplifier consisting of transistors 17 and 18. When the transistor 17 is connected to be on, its collector current $I_2$ is given by $$I_2 = I_1 \frac{h_{FE}}{1 + h_{FE}} \quad (1)$$

If $h_{FE}$ of the transistor 17 is sufficiently large, $$I_2 = I_1 \quad (2)$$

The current $I_3$ is determined by the circuit configuration which is capable of letting flow a current equal or porportional to the collector current $I_2$ of the transistor 17. Now, if this circuit is so arranged as to make the value of current $I_3$ equal to that of the collector current $I_2$ of the transistor 17, the current $I_3$ with which the capacitor 21 is charged is, as seen from Equation (2):

$$I_3 = I_1 \quad (3)$$

When the transistor 18 is connected to be on, the discharge current $I_4$ is given by, $$I_4 = I_1 \frac{h_{FE}}{1 + h_{FE}} \quad (4)$$

If $h_{FE}$ of the transistor 18 is sufficiently large, $$I_4 = I_1$$

Thus, by so constituting this circuit as to make equal the value of the collector current $I_2$ of the transistor 17 and that of the current $I_3$ with which the capacitor 21 is charged, the charging current $I_3$ and the discharging current $I_4$ are made equal, as seen from Equations (3) and (5).

$$\text{Then, } I_3 = I_4 \tag{6}$$

That is, the charging current $I_3$ and the discharging current $I_4$ are equal.

Figure 3:
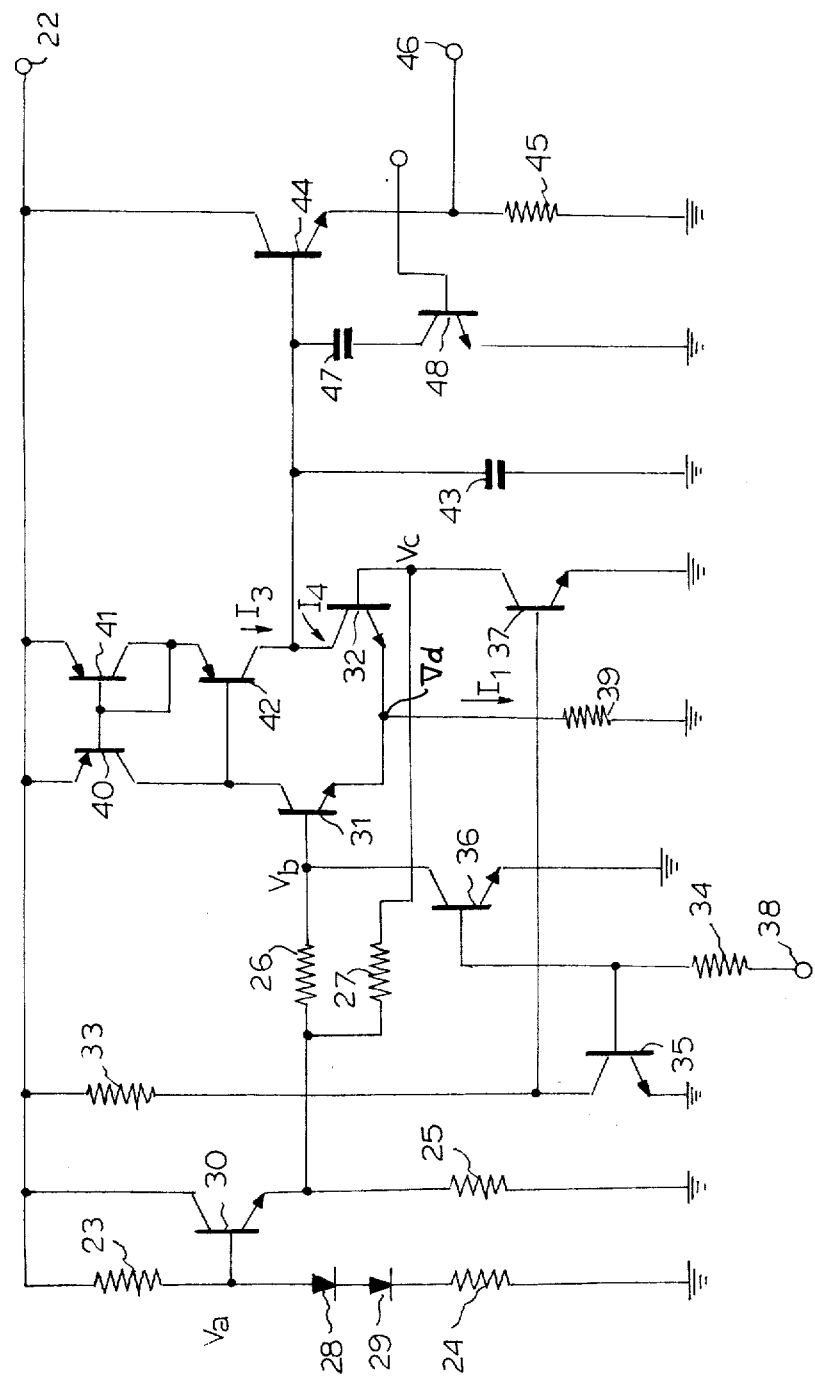
FIG. 3 is a diagram showing an embodiment of the trapezoidal wave forming circuit of this invention.
Figure 4:
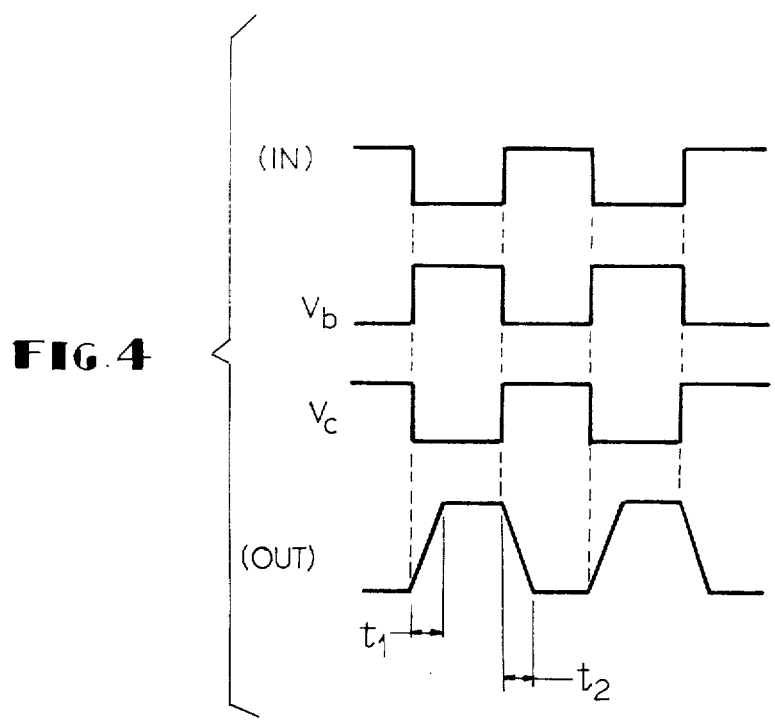
FIG. 4 shows graphs of the wave forms at the respective parts of the circuit of FIG. 3.

FIG. 3 shows a trapezoidal wave forming circuit embodying this invention and FIG. 4 shows wave form graphs at some junctions, respectively.

Referring to FIG. 3, numeral 22 denotes a terminal for the D.C. power source. Resistances 23, 24, 25, 26 and 27 and diodes 28 and 29 and a transistor 30 form the section for supplying the bias to the bases of the differential amplifier composed of transistors 31 and 32. Through the use of the arrangment of resistances 33 and 34 and transistors 35, 36 and 37, the transistors 31 and 32 of the differential amplifier are alternately operated by means of the input signal fed in through a input terminal 38 located at one end of the resistance 34. A resistance 39 sets the value of the constant current. Transistors 40, 41 and 42 constitute a constant current circuit, and numeral 43 designates the charge-discharge capacitor. A transistor 44 and a resistance 45 are provided for supplying the output to an output terminal 46.

Now, in this circuit arrangement, as shown in FIG. 4, the biases $V_b$ and $V_c$ applied to the bases of the transistors 31 and 32 constituting the differential amplifier are varied in the following manner: when the input signal supplied through the input terminal 38 is at a low level (substantially lower than $V_{BE}$), the transistors 35 and 36 are caused to be off, while the transistor 37 is caused to be on. Accordingly, if $V_b$ and $V_c$ at that time is assumed to be $V_{b1}$ and $V_{c1}$, then $$V_{c1} = 0 \tag{7}$$

$$V_{b1} = V_a - V_{BE} \tag{8}$$

On the other hand, if the input signal introduced from the input terminal 38 is at a high level (substantially higher than $V_{BE}$), the transistors 35 and 36 are turned on, while the transistor 37 changed into its off state. Then, assuming $V_b$ and $V_c$ at the latter instance to be $V_{b2}$ and $V_{c2}$, $$V_{c2} = V_a - V_{BE} \tag{9}$$

$$V_{b2} = 0 \tag{10}$$

It may be seen from the above-listed equations that when the input signal given from the input terminal 38 is at a high level, the transistor 32 of the differential amplifier is caused to be on, while the transistor 31 is made off whereas when the input signal is at a low level, the transistor 32 of the differential amplifier is turned off, while the transistor 31 is changed into its on state. Now, assuming the resistances 23, 24 and 39 to be respectively $R_{23}$, $R_{24}$ and $R_{39}$, the emitter bias $V_d$ of the transistors 31 and 32 of the differential amplifier is given by, $$V_d = V_{c1} - V_{BE} = V_{b2} - V_{BE} = V_a - 2V_{BE} \tag{11}$$

The bias $V_a$ at the junction between the resistance $R_{23}$ and the diode 28 is $$V_a = \frac{(V - V_{BE}) \cdot R_{24}}{R_{23} \cdot R_{24}} + 2 V_{BE} \tag{12}$$

From equations (11) and (12), $$V_d = \frac{(V - V_{BE}) \cdot R_{24}}{R_{23} + R_{24}} \tag{13}$$

The current $I_1$ flowing in the transistors 31 and 32 is, $$I_1 = \frac{V_d}{R_{39}} = \frac{(V - V_{BE}) \cdot R_{24}}{R_{23} + R_{24}} \tag{14}$$

Through the use of the arrangement of the PNP transistors 40, 41 and 42, the current $I_2$ which flows in the collector of the transistor 31 and the current $I_3$ with which the capacitor 43 is charged become equal, if $h_{FE}$ of the PNP transistors 40, 41 and 42 is sufficiently large. Accordingly the charge current $I_3$ and the discharge current $I_4$ may be represented by $$I_3 = I_4 = \frac{(V - V_{BE}) \cdot R_{24}}{R_{23} + R_{24}} \tag{15}$$

On this reasoning, if the capacity of the capacitor 43 is denoted by $C_H$, the rise time $t_1$ and the fall time $t_2$ of the trapezoidal wave output become equal, with the undermentioned relationship being established between them:

$$t_1 = t_2 = \frac{(V - 2V_{BE})CH}{I_3} = \frac{(V - 2V_{BE})CH}{I_4} \tag{16}$$

Thus, the charge current $I_3$ and the discharge current $I_4$ are always equal regardless of the variations in $V_a$ due to the mutual disparity between the resistances 23 and 24 and any change in the constant current $I_1$; accordingly, the rise time $t_1$ and the fall time $t_2$ of the trapezoidal wave output are always held equal. On the other hand, if a capacitor 47 is associated with the collector of the transistor 32, and a transistor 48 is inserted between ground and the capacitor 47, the collector and emitter terminals of which are connected to the capacitor 47 and ground respectively, the slopes of the rise and fall of the trapezoidal wave output can be arbitrarily set by supplying a switching signal to the base of the transistor 48. Furthermore, this circuit may be used equally effectively for forming a triangular wave, which is a kind of sawtooth wave, not only a trapezoidal wave.

As described above, according to this invention, a circuit through which the voltage or current is alternately applied, to the bases of the differential amplifier composed of the first and the second transistors is provided; another circuit capable of letting flow a current equal to or porportional to that flowing in the collector of the said first transistor is connected between the power source and the collector of the second transistor; and a condenser is joined to the junction between said latter circuit and said collector, whereby the charge-discharge is of a current equal to or proportional to that of the said collector, so that the sawtooth waves including trapezoidal or triangular waves with their rise and fall times equal or proportional can be formed with stability.

While what are at present considered to be preferred embodiments of this invention have been described hereabove, it should be understood that various modifications may be made therein, and it is intended to cover in the appended claims all such modifications without departing from the true spirit and scope of the invention.

What we claim is:

1. A sawtooth wave forming circuit which comprises a first and a second transistor connected as a differential amplifier, a bias source coupled to the bases of the first and the second transistors, which determines base current and voltage applied on the transistors, a switching circuit connected to the differential amplifier for alternately giving to the first and the second transistors the base current and voltage from the base source, a constant current circuit connected between a power source and the collectors of the differential amplifier for letting flow in the second transistor a current equal to or proportional to the current flowing in the collector of the first transistor, and a capacitor connected between ground and the connection between the constant current circuit and the second transistor of said differential amplifier, whereby the charge-discharge of the capacitor is controlled by means of the current and voltage from the bias source.

2. A sawtooth wave forming circuit as claimed in claim 1 further comprising a second capacitor connected to the connection between the constant current circuit and the differential amplifier, and a second switching circuit connected between ground and the second capacitor.

* * * * *